United States Patent [19]

Heuer

[11] 4,318,130
[45] Mar. 2, 1982

[54] MICROPROCESSOR CONTROL SYSTEM FOR TELEVISION RECEIVERS

[75] Inventor: Daniel A. Heuer, Fort Wayne, Ind.

[73] Assignee: The Magnavox Company, New York, N.Y.

[21] Appl. No.: 932,141

[22] Filed: Aug. 9, 1978

[51] Int. Cl.³ .................. H04B 1/16; H04N 5/44
[52] U.S. Cl. .................... 358/191.1; 358/194.1; 358/198; 455/179; 455/186; 455/353
[58] Field of Search ............ 358/188, 198, 191.1, 358/194.1; 455/150, 151, 177, 179, 186, 352, 353, 355

[56] References Cited
U.S. PATENT DOCUMENTS

| | | | |
|---|---|---|---|
| 3,854,123 | 12/1974 | Banach | 358/191.1 |
| 4,093,921 | 6/1978 | Buss | 455/186 X |
| 4,093,922 | 6/1978 | Buss | 455/186 X |
| 4,127,818 | 11/1978 | Mogi | 455/186 X |
| 4,127,822 | 11/1978 | Mogi et al. | 455/186 X |
| 4,130,804 | 12/1978 | Mogi et al. | 455/186 |

Primary Examiner—Robert L. Richardson
Attorney, Agent, or Firm—Thomas A. Briody; Robert T. Mayer

[57] ABSTRACT

A microprocessor control system is described for effecting channel tuning and function selection in a television receiver. The system will respond to commands entered by a set of controls at the television receiver or to remote control commands received at the television receiver. A channel number display is also provided whereby the channel number of a station currently tuned is displayed. A microprocessor within the system is programmed to validate control information received from an operator either by remotely generated commands or by controls located on the television receiver. Operator supplied information is processed and implemented by the microprocessor control system to effect control over the television receiver.

10 Claims, 5 Drawing Figures

MICROPROCESSOR CONTROL SYSTEM FOR TELEVISION RECEIVERS

BACKGROUND OF THE INVENTION

The apparatus of the invention relates to the television art. Specifically, a microprocessor control system for effecting channel selection and function level adjustments are provided.

Microprocessor technology has recently provided circuit designers with a new basic design component. The microprocessor is capable of duplicating many functions heretofore realized with the use of large scale computer systems. The microprocessors have the advantage of being small, low power consumption devices capable of being programmed with instructions for executing mathematical algorithms on data supplied to the microprocessor. The microprocessor, when properly programmed, will execute a set of instructions providing output data during execution which may be used to control a process or apparatus.

The control of television receivers has heretofore required separate circuits for effecting channel selection, function selection and level setting, and remote control. With the microprocessor it has become possible to control these performance aspects with a single preprogrammed microprocessor and suitable input/output circuits. Data indicating the selection of a new channel to be tuned or a function to be controlled by an operator of the television receiver may be supplied to the input port of the microprocessor. This data may be supplied from a set of hand controls or a transducer for detecting remotely generated commands. Remote control systems presently incorporated in many television receivers provide operation of a television receiver by transmitting information bearing ultrasonic sound waves or infrared light waves to the television receiver. These waves when received at the television receiver are decoded into an electrical signal for effecting the change in channel tuning or function level. The microprocessor has the capability of validating this electrical signal and performing all decoding pursuant to preprogrammed instructions. These instructions, when executed by the microprocessor, generate a digital signal for effecting the desired channel change or function level change.

SUMMARY OF INVENTION

In accordance with the invention, a microprocessor controller for television receivers is provided. Channel selection and function level adjustments to the television receiver are effected by addressing a general purpose microprocessor with data bearing instructions from a set of controls at the television receiver or from remote control commands received at the television receiver.

Channel selection is accomplished by customer interface controls to the microprocessor which provide a particular channel number selection in the UHF or VHF frequency spectrum which is to be tuned. A memory containing channel tuning data for each channel in the UHF or VHF frequency spectrum is operably connected by a control bus to the microprocessor. The memory when addressed provides channel tuning data which the microprocessor converts into a multibit digital signal for establishing a tuning voltage. A digital to analog converter is operably connected to the microprocessor to provide a d.c. voltage for tuning a varactor tuner in response to the multibit digital word.

In another aspect of the invention, the microprocessor controller will provide function level control when another set of instructions is executed. The microprocessor, for example, will generate a digital code indicating a volume level and modify the code according to instructions received by the customer operable controls. The modified word is routed to the digital to analog converter and a d.c. voltage level is produced for establishing a volume level.

In still another aspect of the invention, the microprocessor will decode remote control commands. The output signal of a transducer for receiving remote control signals is applied to the microprocessor so these signals for channel change and set control are validated, decoded and the commands are executed by the microprocessor controller.

DESCRIPTION OF THE PREFERRED EMBODIMENT

Figure 1:
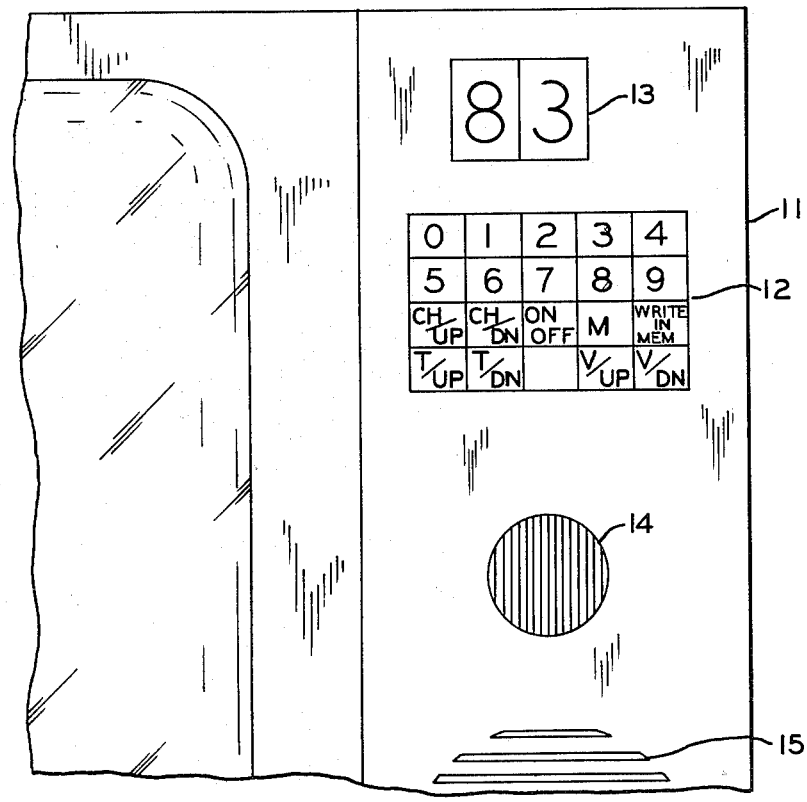
FIG. 1 is an illustration of a television receiver control panel incorporating a microprocessor control system.

Referring now to FIG. 1, there is shown the control panel 11 of a television receiver. A keyboard 12 contains a plurality of controls for operating the television receiver. There are ten keys numbered zero through nine which provide direct tuning to a channel number selected by the television receiver operator. If channel eighty-three is desired, for instance, digits eight and three are depressed in sequence. The channel selection causes the television receiver to tune to the selected channel number while providing a display of that channel number on a two digit number display 13.

Keyboard 12 contains numerous other keys which when depressed influence the channel selection of the television receiver. A CHANNEL-UP and CHANNEL-DOWN key is provided which will scan all channel frequencies of the television receiver in a direction depending upon whether the CHANNEL-UP or CHANNEL-DOWN key was depressed. This CHANNEL-UP or CHANNEL-DOWN sequentially produces all channels whose tuning frequencies are identified by data contained in a memory within the television receiver.

Analogous to the CHANNEL-UP and CHANNEL-DOWN key selections, are TUNE-UP and TUNE-DOWN key selections which will provide continuous tuning of the television receiver. The continuous tuning will tune the television receiver from the low end of the VHF television spectrum to the upper end of the UHF television spectrum. This operation is to be distinguished from the CHANNEL-UP and CHANNEL-DOWN keys which provide scanning of television tuning frequencies previously programmed in the memory within the television receiver.

A WRITE-IN MEMORY key is provided which allows the receiver operator to modify the channel tuning data stored within the memory. If a channel number is selected fine tuning may be accomplished by selectively operating the TUNE-UP and TUNE-DOWN controls on the control panel. The data specifying the fine tuned received frequency is entered in the memory at the address identified by the presently indicated channel number replacing the original data.

Other keys shown on keyboard 12 include a VOLUME-UP and VOLUME-DOWN key pair for increasing or decreasing the volume level of the television receiver. A mute key is also provided for disabling the signal to speaker 15 leaving only the picture displayed.

Also shown on control panel 11 is a microphone 14 for receiving ultrasonic remote control commands. In many television receivers a remote control feature is present whereby ultrasonic signals indicating a channel change, channel-up, channel-down, volume-up or volume-down may be initiated from a remote location. These commands in the nature of ultrasonic signals are detected and an electrical signal is generated which the television receiver control system interprets. The interpreted commands are executed and the remotely selected function or channel is effected by the receiver control circuitry.

Figure 2:
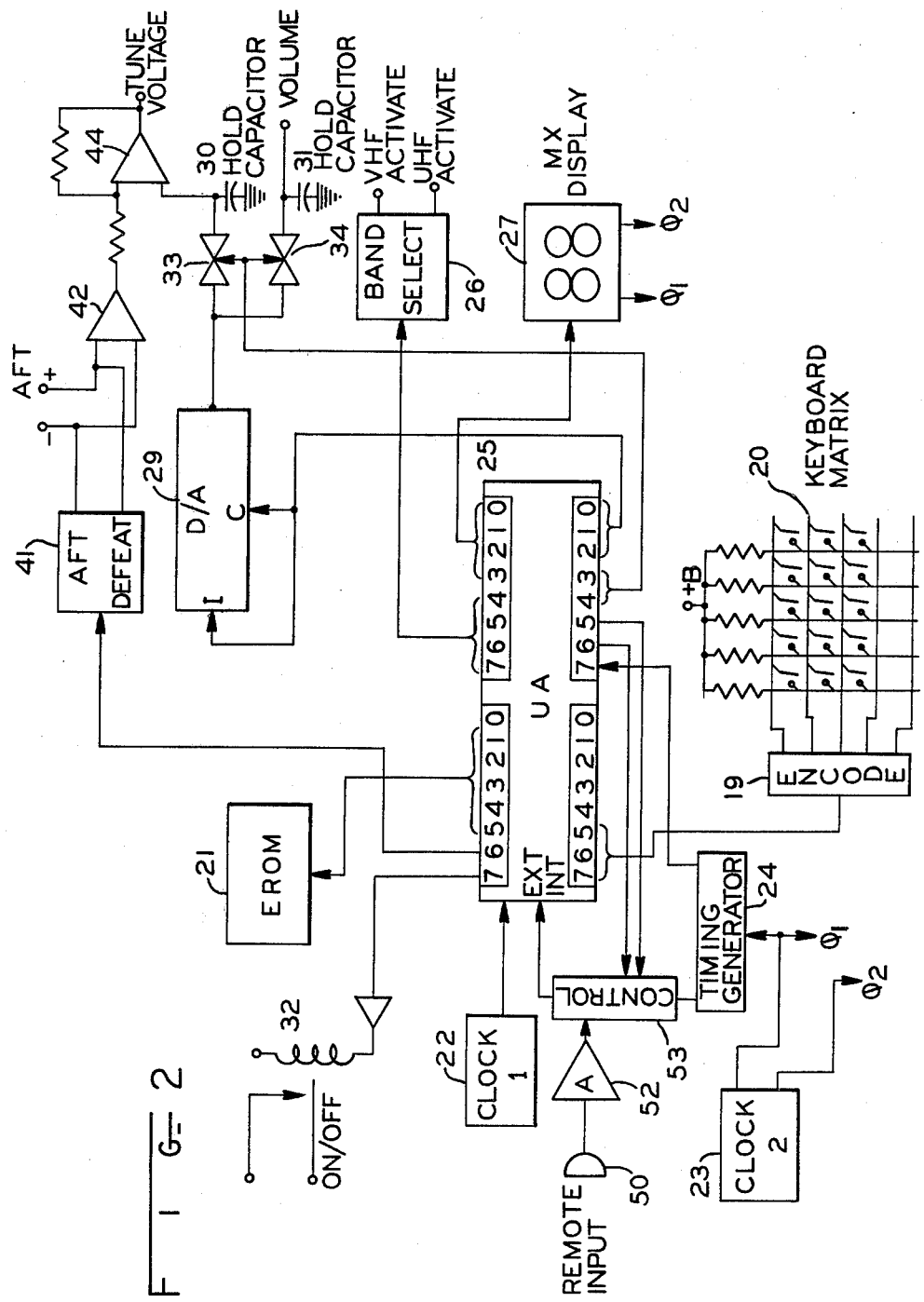
FIG. 2 is a schematic drawing of one embodiment of the invention.
Figure 3:
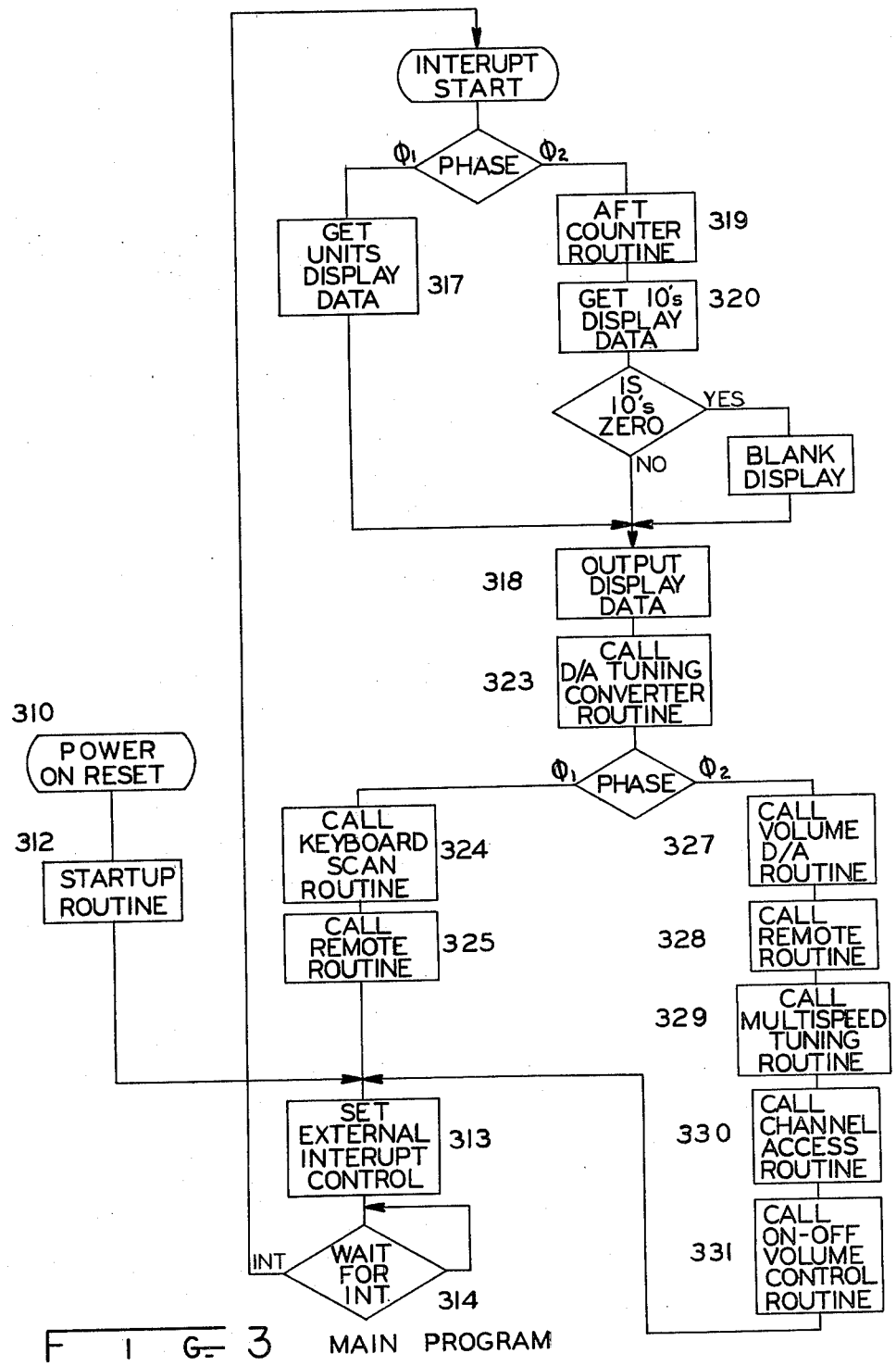
FIG. 3 is a flow diagram illustrating the software control of the apparatus shown in FIG. 2.

Referring now to FIG. 2, there is shown an overall block diagram of the television receiver control circuitry of this invention. An EAROM 21 (electrically alterable read only memory) contains channel tuning information which when accessed by a microprocessor 25 provides information from which a channel tuning voltage may be derived. The EAROM 21 may store as many as one hundred fourteen-bit binary words. The EAROM 21 is an MNOS device that stores a charge to indicate a "1". The absence of a charge indicates a "0". The memory 21 is non-volatile and the stored charge will remain for many years. The memory contains channel tuning information for channels 2-83. This channel tuning information is in the form of fourteen-bit tuning words. Two of the bits for each tuning word indicate band information to distinguish UHF from VHF channels. The remaining bits provide a code which identifies a dc tuning voltage to be applied to a varactor tuner having a tuning frequency proportional to the applied voltage. A tuning word is addressed when a channel selection is made and is entered into a scratch pad register within the microprocessor. An algorithm consisting of a set of stored instructions within the microprocessor supplies the tuning word to an output port of the microprocessor which when converted to a d.c. voltage establishes a tuning frequency for a varactor tuner.

Two memory addresses within the EAROM 21 contain other data. The first of these addresses contains an eight-bit word for identifying the last channel to have been viewed on the television receiver. When receiver power is first turned on the microprocessor control system tunes the television receiver to the channel identified by the data stored within the EAROM 21 at this first address which is the last channel to be tuned.

The remaining memory location is used to implement a memory "refresh" program which is a part of the software for the microprocessor tuning system. The bits of binary information comprising a tuning word are stored by the presence or absence of an electric charge. The electric charge decays in time whereby the level of charge may become so small as to be unrecognizable. An address of one of the tuning words is located in the second memory location. When the initialize program stored in the microprocessor begins, the contents of the memory location identified by the address in the second memory location are "refreshed" by removing them temporarily from the memory and writing the tuning word back in its memory location. At the completion of the rewrite function, the address of the next succeeding channel tuning word is thereafter written into this memory location. Each time that the power is turned on, a new channel tuning word is refreshed. This provides for refreshing all the memory contents preventing loss of the tuning words over a period of time.

A first clock 22 is provided for supplying a signal to the microprocessor 25. Microprocessors designated as F8 Family, specific part number MK3870, sold by MOSTEK, work well in this application. Microprocessor 25 uses the pulses from clock generator 22 to execute commands and make internal computations pursuant to an algorithm programmed in the microprocessor 25. This clock rate is usually 2-4 mHz. A second clock 23 provides two clock pulses which are denoted as phase one and phase two. The two clock pulses alternate one hundred and twenty cycles per second and provide drive signals to the multiplex display 27. One of the clock pulses is supplied to the timing generator 24 to provide a 120 cps timing signal. The timing afforded by the clock pulses will be realized when the software aspects of a microprocessor 25 are discussed and the remote function is described. The keyboard matrix 20 contains a plurality of switches which are operated by the keyboard of FIG. 1. The contact closure of one of these switches indicates that the operator has selected the function or channel number associated with the switch. The contact closure is encoded by encoder 19 and microprocessor 25 executes a command in response to the encoded signal. The keyboard therefore serves as a command or control entry source for the microprocessor 25.

A two digit display 27 is provided for displaying a channel number supplied by microprocessor 25. The display 27 shown is a multiplex display 27 whereby during phase two of clock generator 23 a units digit is displayed, and during phase one of the clock generator 23 a tens digit is displayed. Clock drive signals from clock 23 alternately cause the tens and units digits to be illuminated. The multiplexed display 27 allows for common circuitry to be used in the generation of each digit of the display. The alternate display of a units and tens digit is perceived as a simultaneous display by viewers of the digital display unit 27. When channel tuning is addressed by the microprocessor, the address code is decoded into a binary coded decimal code for indicating the tens digit and units digit. These binary decimal digits are alternately supplied to the display 27 by the software contained within the microprocessor 25. Band select circuitry 26 is used to activate either the VHF tuner B+ or the UHF tuner B+. In this manner, the microprocessor 25 may, depending upon the particular channel or tuning information being supplied by the microprocessor, activate one or the other of the corresponding tuners. The proper band information is carried by two bits of the tuning words stored in EAROM 21. When channel tuning data is addressed by a particular channel selection, the microprocessor 25 decodes these two bits and either the VHF or UHF B+ is enabled on a varactor tuner. A tuning voltage supplied by amplifier 44 to the two varactor tuners caused the proper frequency to be tuned.

A power ON relay 32 is connected to I/O port of the microprocessor. When an ON or OFF command is initiated by either a key depression or a remote control command, the relay will be energized or deenergized, depending on its previous state.

Digital to analog converter 29, hereinafter referred to as D/A converter, receives digital words from the microprocessor 25 for conversion into a d.c. voltage. The microprocessor will alternately supply digital data for indicating channel tuning frequency and volume level as the stored program is executed, continually updating or refreshing the volume level and channel tuning voltage. In the figure shown, it is contemplated that the serial D/A converter will be used whereby a serial number, specifying a tuning voltage or a volume level will be presented to the data input of D/A converter 29. A second digital signal will be presented to the control input of D/A converter 29. As each serial bit is supplied to the input of D/A converter 29, controls signals on the control input of D/A converter 29 will increment or decrement the d.c. voltage supplied by D/A converter 29. At the conclusion of the D/A conversion, a hold capacitor 30 is supplied with the d.c. voltage through a QUAD bilateral switch 33 or 34, known to those skilled in the art. QUAD bilateral switch 33 is activated by the microprocessor at the completion of tuning D/A conversion to transfer conversion voltage to hold capacitor 30. If the D/A converter 29 is receiving serial data establishing a volume level, the d.c. voltage resulting therefrom at the output of D/A converter 29 is supplied to QUAD bilateral switch 34. QUAD bilateral switch 34 is enabled in response to an indication from the microprocessor that the data being transferred to the input of D/A converter 29 is volume control data. A corresponding hold capacitor 31 is charged or discharged to the d.c. level produced in response to the volume data received by D/A converter 29.

Figure 4:
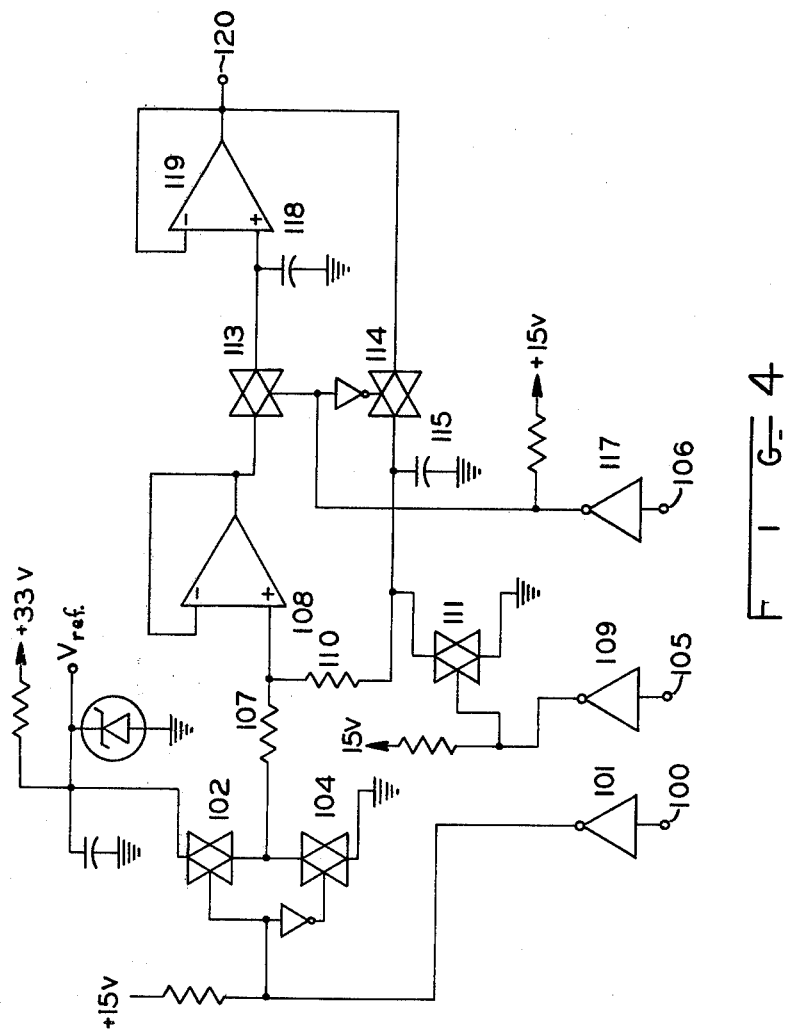
FIG. 4 is a schematic drawing of an analog to digital converter for use with the microprocessor controlled system.

Referring now to FIG. 4, there is shown a D/A converter for use with the system shown in FIG. 2. A clear pulse is applied to terminal 105 prior to receiving serial data. Serial data from the microprocessor is applied to terminal 100, the least significant bit being applied first. Inverters provide voltage level conversion of the microprocessor output to a voltage level to which the peripheral circuitry can respond. An inverter 101 applies the level shifted data to the input of two serially connected transmission gates 102, 104. When serial data of logic 0 is applied to terminal 100, Vref is applied to resistor 107. If resistor 107 and resistor 110 are of equal resistance, the output voltage provided by voltage follower 108 is as follows:

$$V_0 = Vc115 + (Vref - Vc115)/2$$

If a logic 1 is applied to terminal 100, the output voltage is as follows:

$$V_0 = Vc115/2$$

Capacitor 118 charges to a voltage level indicated by the preceding equations. A transfer pulse is provided from the microprocessor which will close transmission gate 113 and open transmission gate 114 whereby the voltage on capacitor 118 will be transferred to capacitor 115. At the conclusion of the receipt of a first bit of digital data, gate 113 is closed and transmission gate 114 is opened. A d.c. voltage indicative of the second bit of information is developed on capacitor 118. The next succeeding transfer pulse will transfer this voltage to capacitor 115.

Figure 5:
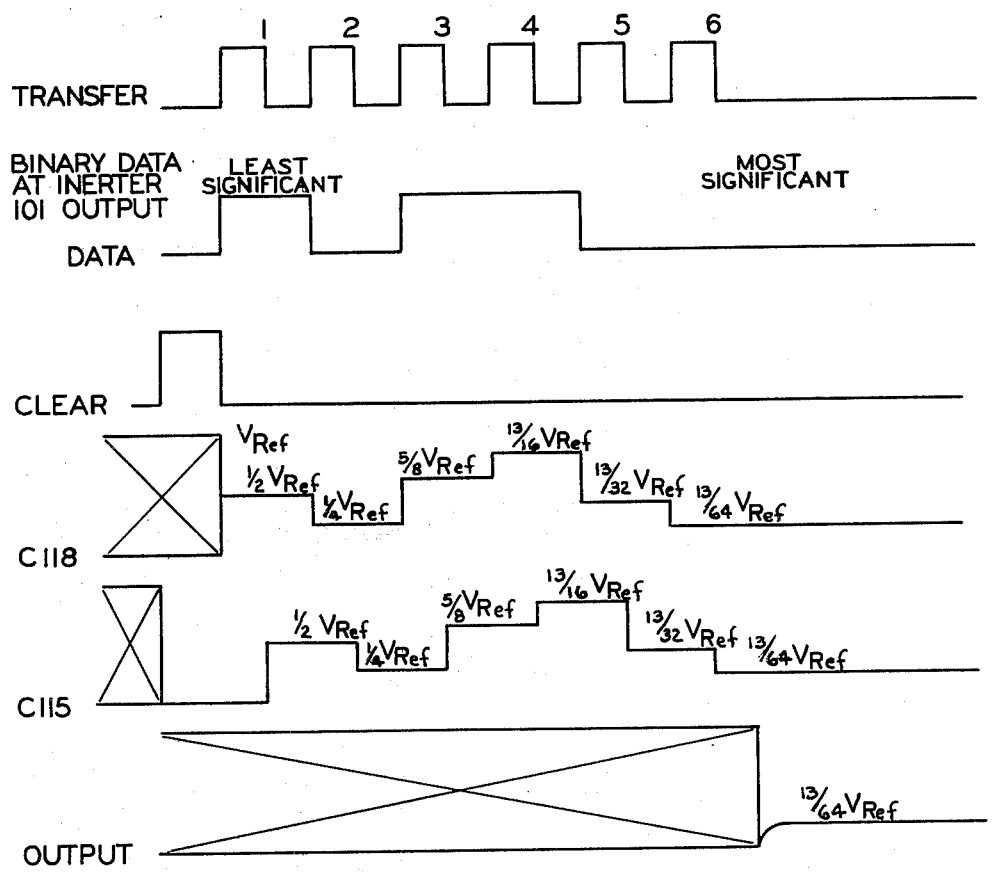
FIG. 5 illustrates the operation of the circuit shown in FIG. 4.

Referring now to FIG. 5, a timing diagram indicating the operation of the circuit of FIG. 4 when receiving the digital word applied to terminal 100 is shown. A clear pulse is first applied to terminal 105 and capacitor 115 is discharged. A binary 1 is produced by inverter 101 and capacitor 118 is charged to $\frac{1}{2}$ Vref. A transfer pulse is applied to terminal 106 and capacitor 115 is charged with the voltage level stored on capacitor 118. The sequence continues until all of the data bits have been converted to a representative voltage level and transferred to C118.

Returning to FIG. 2, an AFT defeat circuit 41 is also provided. During the tuning sequence, when either a new channel selection is made, or a tune-up, tune-down command is given, the AFT (automatic fine tuning) control is defeated. The AFT voltage is presented in the embodiment shown as a differential voltage to the input of a gain controllable amplifier 42. The AFT error signal indicates the tuning error between the desired tuning frequency and the present tuning frequency. In order to change the channel tuning, it is necessary to defeat this error signal which tends to hold the tuning frequency to a preestablished limit. The AFT voltage, converted to a single ended voltage, is summed in amplifier 44. Together these summed voltages provide the tuning voltage for both the UHF or VHF varactor tuner.

The remaining portion of the apparatus shown in FIG. 2 is concerned with receiving ultrasonic remote control commands and processing these commands to provide a signal recognizable by the microprocessor 25. The remote control input 50 consists of a microphone which converts ultrasonic commands indicating function or channel change into an electrical signal. The electrical signal is amplified by an amplifier 52 and limited whereby amplitude variations in the remote signal are removed. The signal produced by the amplifier 52 is amplified to a control network 53 whereby signals to the external interrupt of the microprocessor are controlled. Control network 53 receives signals from the remote input as well as a 120 cps timing signal. The timing signal is achieved by differentiating one of the signals produced by clock 23. The timing generator 24 also produces a square wave signal indicative of whether phase one or phase two pulses are present. The microprocessors will operate control network 53 to receive either a remote input signal or a 120 cps signal from the timing generator. The programming within microprocessor will indicate that the 120 cps signal is to be connected to the external interrupt terminal. Receipt of these pulses will synchronize execution of the software to the 60 cps signal supplied to the display. When the REMOTE routine is executed, signals appearing on the remote input will be routed to the external interrupt pin. Each cycle of a remote signal is counted and decoded by the microprocessor for a predetermined amount of time. At the conclusion of the REMOTE routine, the control network will supply 120 cps pulse again. Each 120 cps pulse begins execution of a new set of program instructions according to the phase of the 60 cps signal supplied by timing generator 24.

The microprocessor 25 will periodically execute the REMOTE program stored within. During the execution of the program, the control network 53 in response to a command from the microprocessor 25 will supply the signal processed by the microphone 50 and amplifier 52 to the external interrupt of the microprocessor. The remote input signal comprises an amplitude limited sign wave in the frequency range of 31.5 to 45 kHz. The remote program validates the signal by sampling a number of cycles of the signal. Once validated by the microprocessor 25, the signal frequency is determined and a function change or channel change is effected by the microprocessor 25.

At the end of the REMOTE program, the control network 53 connects the external input of the microprocessor 25 to timing generator 24 which supplies a pulse every 1/120 seconds to the external input of microprocessor 25 allowing the microprocessor 25 to continue execution of its programming.

SOFTWARE DESCRIPTION

The beginning of the software control of the microprocessor tuning system is indicated by 310. The start of the program is initiated by a power on reset 310 command to the microprocessor 25. This command resets the program counter within the microprocessor 25 to zero indicating the beginning of the software routine. A STARTING routine 320 is initiated at the onset of software execution which clears the registers in the microprocessor 25 preventing the register contents from being randomly set. After resetting the registers to have zero's for contents, certain scratch pad registers in the microprocessor 25 which contain volume data, tuning data, and channel number data are preset whereby the television receiver is initially operated at established volume levels, channel tuning and a channel number is displayed corresponding to this preselected channel number. The STARTING routine brings channel number data from the EAROM into the register of a scratch pad containing channel number information. This channel number data corresponds to the address of the last tuned channel data in EAROM 21. Once the channel number information is in scratch pad memory, another scratch pad register is loaded with the tuning data corresponding to this particular channel number. The STARTING routine also clears the microprocessor 25 interrupt control register so that it is ready to receive commands for decoding pulses on the interrupt input of the microprocessor. The television receiver is initially turned off by the STARTING routine until this initialization of scratch pad registers is completed. Initialization also includes the clearing of any registers indicating the status of any particular function and accomplishes the refresh function described in connection with the EAROM 21.

One the STARTING routine is completed, the Set External Interrupt Control 313 routine is enabled to detect a first clock pulse transition which occurs on the interrupt input. The microprocessor control is set to recognize certain specific input format as indicating an interrupt function. Once interrupt control is established, the microprocessor 25 will act on any valid interrupt input.

When a valid interrupt is received, which may be a clock pulse transition of phases one or two, provided by clock 23, the main program begins. Depending upon which clock phase initiates the interrupt, a set of subroutines will be completed in order. When a given set of subroutines corresponding to the particular clock phase is completed, a subsequent clock phase causes new subroutines as well as some subroutines which were previously executed in the other clock phase to be re-executed.

If the phase one clock pulse transition has occurred a subroutine 317 is executed for determining the units digit of the channel number to be displayed. A scratch pad register within the microprocessor contains channel number data to be displayed. The last channel number entered in the scratch pad register corresponding to the units digit is detected and a second output display program causes the units digit to be displayed. The data in the scratch pad register for indicating channel number was previously set by the STARTING routine. This number is modified as the microprocessor software indicates the number has been changed by the television receiver operator.

If a clock pulse indicating phase two had been applied to the interrupt input, a different routine would have been enabled. The AFT COUNTER routine 319 would have been selected whereby the sound for the television receiver is muted and the AFT control is turned off so that channel changing and tuning of the television receiver could be accomplished.

After completion of the AFT COUNTER routine 319, the TENS DIGIT DISPLAY routine 320 is executed during phase two of the clock cycle. The scratch pad register containing the channel number is interrogated and the channel number tens digit is read out. The channel number display has the tens digit illuminated if a number other than zero is established in the tens digit location in the scratch pad register. If the number zero is indicated to be the tens digit by the scratch pad register, the display is blanked to prevent a zero from being displayed. Therefore, channel 2 appears as channel 2 rather than 02.

Continuing through the program execution sequence, during each clock phase the DIGITAL TO ANALOG CONVERSION routine 323 is entered. The D TO A CONVERSION routine provides data and control signals for controlling the serial digital to analog converter.

Continuing with the main program flow, the phase one clock cycle will call forth the KEYBOARD SCAN routine 324. This subroutine detects a contact closure of a switch or switches on the keyboard matrix. The KEYBOARD SCAN routine 324 contains a program for validating a contact closure so that several scans of the switch contacts are completed and a number of consecutive contact closure detections are required before the contact closure is detected. The closure of a particular switch in a keyboard matrix causes a flag identifying the selected function to be set in the particular scratch pad holding contents for determining that function's level setting. Once the KEYBOARD SCAN routine is complete the REMOTE routine is enabled whereby the input on the ultrasonic remote control is sampled. If a valid input signal is determined, indicating that a command has been received, the remote routine 325 will thereafter decode the received command. The decoded command is associated with the function with which it represents. Flags are set in the appropriate scratch pad register indicating that this function is to be altered. By setting flags in the scratch pad register through either the REMOTE routine 325 or the KEYBOARD SCAN routine 324, the functions will be altered by other subroutines as they are encountered.

During the phase two clock cycle transition, the VOLUME D/A routine 327 is executed. The scratch pad register containing volume information is serially presented to a digital to analog converter external to the microprocessor. The microprocessor controls the serial to analog converter such that each digit presented representing the volume level is converted to a d.c. voltage and routed to the volume control function module.

Following the VOLUME D/A routine the REMOTE routine 325 is again encountered during this phase and is executed as was done in the previous clock phase.

The MULTI-SPEED TUNING routine 329 is thereafter called for tuning the television receiver at different speeds. When the KEYBOARD SCAN routine 324 indicates that tune-up or tune-down commands have been executed, the code representing the tuning voltage stored in a scratch pad register in incremented or decremented at a varying rate depending upon how long the contact closure or remote control signal indicating a tune-up or tune-down command is sensed. The varactor tuner has a frequency versus voltage response which has a slope which decreases with tuning voltage. A software look up table within the microprocessor contains data which describes this changing slope of the varactor tuner curve. The varactor tuner curve is divided into eight segments and a tuning speed is associated with each segment which is related to the slope of each segment. Therefore, the speed associated with each segment is sequentially read out as tuning proceeds from one end of the band to the other.

The next subroutine encountered is the CHANNEL ACCESS routine 330 which will sense whether a channel-up or a channel-down sequence is selected. If the keyboard or remote input indicates this, the channel tuning data with the EAROM 21 is sequentially entered in a scratch pad register. The final subroutine encountered is the ON/OFF AND VOLUME CONTROL routine 331 which senses the scratch pad register associated with the different functions. The flags set in the volume control register will be detected indicating that either volume is to be increased or decreased. The presence of a flag in this register will cause an increment in the scratch pad register containing a number representing a volume level. Thereafter, the scratch pad number will reflect the changed volume level. During the VOLUME D/A routine, this number will be read out and a changed volume level results.

Machine language for implementing the routines previously described are given in Table 1. Table 1 represents a set of instructions which may be permanently placed in the ROM of the microprocessor for execution. The instructions are in hexidecimal format. The extreme left of the column contains an address, the first being M0000. The data to the left of this address is the data for addresses 0000 through 0007.

The hexidecimal information including instructions as well as data is used in the F-8 microprocessor described more particularly in the data sheets supplied by MOSTEK, entitled "F8 Microprocessor Devices, Single Chip Microcomputer MK3870" hereby incorporated by reference.

Thus there is described one embodiment of a microprocessor control system for television receivers. Those skilled in the art will recognize other embodiments described more particularly by the claims that follow.

TABLE I

| Addr | | | | | | | | |
|---|---|---|---|---|---|---|---|---|
| M0000 | = | 1A | 20 | 80 | B0 | 60 | 68 | 70 | 5C |
| M0008 | = | 0A | 1F | 0B | 25 | 3F | 81 | F8 | 62 |
| M0010 | = | 68 | 7C | 5C | A4 | 22 | F0 | B4 | 28 |
| M0018 | = | 00 | 41 | 66 | 68 | 20 | 66 | 90 | 02 |
| M0020 | = | 0D | DC | 54 | 55 | 28 | 00 | 41 | 66 |
| M0028 | = | 69 | 4E | 56 | 4D | 62 | 5D | 46 | 5D |
| M0030 | = | 45 | 5C | 65 | 5C | 2A | 00 | 5B | 46 |
| M0038 | = | 14 | 21 | 03 | 8E | 16 | B4 | 29 | 01 |
| M0040 | = | 3B | 08 | 28 | 02 | 1E | 28 | 00 | 7F |
| M0048 | = | 28 | 01 | 4E | 28 | 00 | 7F | 28 | 01 |
| M0050 | = | 8F | 28 | 00 | 7F | 28 | 01 | AB | 28 |
| M0058 | = | 00 | 7F | 0C | E0 | D0 | B0 | 70 | F4 |
| M0060 | = | F3 | F2 | F0 | EC | E8 | E3 | DF | FC |
| M0068 | = | FC | FB | FA | F6 | F4 | F1 | F0 | 1E |
| M0070 | = | 19 | 15 | 11 | 0C | 08 | 04 | 00 | 3C |
| M0078 | = | 33 | 2B | 22 | 19 | 11 | 08 | 00 | 20 |
| M0080 | = | 00 | A0 | 21 | DF | B0 | 20 | 00 | 1C |
| M0088 | = | 1D | 60 | 17 | C2 | 09 | 80 | 3D | F2 |
| M0090 | = | 15 | 40 | 35 | D0 | 31 | 42 | 15 | 40 |
| M0098 | = | 17 | 46 | 3D | 48 | 35 | E6 | 3D | FA |
| M00A0 | = | 0C | 62 | 6B | A0 | 91 | 3C | A1 | 81 |
| M00A8 | = | 05 | 7F | FC | 90 | 36 | 64 | 68 | 20 |
| M00B0 | = | 7F | FC | 84 | 28 | 3C | 20 | 7F | FC |
| M00B8 | = | 84 | 11 | A0 | 21 | BF | B0 | 70 | CC |
| M00C0 | = | 91 | 1A | 62 | 68 | 4C | 22 | 80 | 5C |
| M00C8 | = | 90 | 12 | A0 | 22 | 40 | B0 | 70 | 5C |
| M00D0 | = | 6A | 78 | FC | 94 | 07 | 62 | 68 | 4C |
| M00D8 | = | 21 | 3F | 5C | 62 | 6B | 4C | 14 | 94 |
| M00E0 | = | 02 | 7F | 18 | 21 | 0F | 50 | A4 | 21 |
| M00E8 | = | F0 | C0 | B4 | 28 | 05 | 1B | A1 | 91 |
| M00F0 | = | 0C | 28 | 02 | 4E | 28 | 06 | 3D | 28 |
| M00F8 | = | 07 | 0A | 90 | 40 | 28 | 05 | 0D | 28 |
| M0100 | = | 06 | 3D | 28 | 02 | 97 | 28 | 03 | F0 |
| M0108 | = | 28 | 05 | 70 | 6B | 6E | 72 | FC | 64 |
| M0110 | = | 6A | 94 | 07 | 4C | 21 | DF | 5C | 90 |
| M0118 | = | 23 | 20 | 20 | FC | 94 | 1E | 4C | 22 |
| M0120 | = | 20 | 5C | 28 | 01 | AB | 66 | 68 | 4D |
| M0128 | = | 50 | 4D | 62 | 5E | 40 | 5D | 2A | 00 |
| M0130 | = | 5B | 4C | 14 | 21 | 03 | 8E | A4 | 21 |
| M0138 | = | 0F | 88 | B4 | 2A | 00 | A1 | 11 | 4A |
| M0140 | = | 04 | 4B | 05 | A1 | 21 | 1F | 22 | 40 |
| M0148 | = | B1 | 71 | B6 | 1B | 90 | FF | 79 | 51 |
| M0150 | = | 70 | 53 | A0 | 21 | C0 | 52 | 44 | 14 |
| M0158 | = | 50 | 94 | 05 | 20 | 30 | 90 | 03 | 20 |
| M0160 | = | 32 | C2 | B0 | 31 | 91 | 0F | 71 | 24 |
| M0168 | = | FF | 94 | FD | 30 | A0 | 21 | DF | B0 |
| M0170 | = | 70 | C0 | 90 | E6 | 70 | C3 | 94 | 0A |
| M0178 | = | 71 | 53 | 79 | 51 | 7F | F4 | 50 | 90 |
| M0180 | = | EC | A0 | 21 | DF | B0 | 72 | 24 | FF |
| M0188 | = | 94 | FD | 20 | 3C | C2 | B0 | 1C | A0 |
| M0190 | = | 21 | C0 | 24 | 2C | 51 | B0 | 72 | 50 |
| M0198 | = | 30 | 94 | FE | 20 | DF | F1 | B0 | 72 |
| M01A0 | = | 50 | 30 | 94 | FE | 20 | C0 | F1 | 24 |
| M01A8 | = | 3C | B0 | 1C | 66 | 69 | 75 | 51 | 70 |
| M01B0 | = | 52 | A0 | 21 | C0 | 24 | 2A | 50 | B0 |
| M01B8 | = | 90 | 01 | 90 | 01 | 4C | 12 | 5C | 40 |
| M01C0 | = | 21 | DF | B0 | A0 | 15 | 13 | 13 | 13 |
| M01C8 | = | CC | 5C | 31 | 91 | 04 | 40 | 90 | E8 |
| M01D0 | = | 70 | C2 | 94 | 0D | 71 | 52 | 4C | 12 |
| M01D8 | = | 12 | 5C | 68 | 77 | 51 | 40 | 90 | D8 |
| M01E0 | = | 40 | 21 | C0 | 24 | 3C | B0 | 1C | 66 |
| M01E8 | = | 69 | 75 | 51 | 70 | 52 | A0 | 21 | C0 |
| M01F0 | = | 24 | 20 | 53 | 71 | FC | 84 | 02 | 72 |
| M01F8 | = | C3 | B0 | 4C | 12 | 5C | 72 | 50 | 30 |
| M0200 | = | 94 | FE | A0 | 21 | DF | B0 | 31 | 91 |
| M0208 | = | 03 | 90 | E9 | 70 | C2 | 94 | 07 | 68 |
| M0210 | = | 77 | 51 | 52 | 90 | DF | 20 | 1C | C3 |
| M0218 | = | B0 | 1C | 20 | 34 | 90 | 07 | 20 | 3C |
| M0220 | = | 90 | 03 | 20 | 24 | 52 | 20 | 50 | 50 |
| M0228 | = | 71 | 51 | A0 | 21 | C0 | C2 | 52 | 42 |
| M0230 | = | B0 | 72 | 53 | 33 | 94 | FE | 20 | DF |
| M0238 | = | F2 | B0 | 71 | 53 | 33 | 94 | FE | 30 |
| M0240 | = | 94 | EE | 70 | C1 | 84 | 04 | 31 | 90 |
| M0248 | = | E7 | 42 | 22 | 1C | B0 | 1C | 63 | 69 |
| M0250 | = | 20 | BF | 51 | 18 | B5 | 74 | 50 | 30 |
| M0258 | = | 94 | FE | A5 | 18 | 21 | 1F | 52 | 4C |
| M0260 | = | 21 | 1F | E2 | 84 | 05 | 42 | 5C | 90 |
| M0268 | = | 1B | 4C | 14 | 12 | 24 | FD | 81 | 07 |
| M0270 | = | 20 | 20 | CC | 5C | 90 | 0E | 4C | 21 |
| M0278 | = | 1F | 52 | 0A | 53 | 24 | 06 | 0B | 42 |
| M0280 | = | 5C | 43 | 0B | 41 | 14 | 12 | 84 | 0F |
| M0288 | = | 24 | FF | 15 | 13 | 24 | 1F | 51 | 0A |
| M0290 | = | 24 | FF | 0B | 41 | 90 | BE | 1C | 63 |
| M0298 | = | 6D | 74 | FC | 84 | 3D | 64 | 6A | 74 |
| M02A0 | = | FC | 94 | 57 | 4C | 22 | 04 | 5D | 65 |

TABLE I-continued

| | | | | | | | | |
|---|---|---|---|---|---|---|---|---|
| M02A8 | = | 71 | 5C | 65 | 6B | 20 | 67 | DC | 5C |
| M02B0 | = | 54 | 50 | 82 | 1F | 2A | 03 | E6 | 40 |
| M02B8 | = | 24 | 66 | 89 | 82 | FB | 74 | 8E | 28 |
| M02C0 | = | 00 | 41 | 66 | 69 | 4C | 21 | 0F | 8B |
| M02C8 | = | 5C | 65 | 6B | 4C | 54 | 28 | 04 | E9 |
| M02D0 | = | 90 | D9 | 62 | 6B | 4C | 65 | 5C | 90 |
| M02D8 | = | 21 | 72 | FC | 84 | 20 | 64 | 6A | 20 |
| M02E0 | = | 40 | FC | 94 | 16 | 4C | 22 | 40 | 5D |
| M02E8 | = | 65 | 4E | 54 | 12 | 84 | 0C | 62 | 4E |
| M02F0 | = | 50 | 4E | 66 | 5D | 40 | 5C | 28 | 04 |
| M02F8 | = | E9 | 29 | 01 | 3B | 4C | 52 | 21 | 18 |
| M0300 | = | 94 | 22 | 6E | 74 | FC | 84 | 0F | 64 |
| M0308 | = | 6A | 20 | 10 | FC | 84 | 08 | 20 | AB |
| M0310 | = | FC | 5C | 6B | 90 | D4 | 64 | 6A | 20 |
| M0318 | = | AB | FC | 5C | 6F | 70 | 5E | 5E | 5C |
| M0320 | = | 29 | 01 | 05 | 64 | 6A | 4C | 22 | 10 |
| M0328 | = | 5C | 68 | 20 | BE | 5C | 63 | 6D | 71 |
| M0330 | = | FC | 84 | 0F | 64 | 3C | 91 | 04 | 29 |
| M0338 | = | 01 | 08 | 74 | 5C | 70 | 50 | 29 | 03 |
| M0340 | = | 84 | 64 | 6F | 3C | 81 | 0F | 20 | 33 |
| M0348 | = | 5E | 4C | 25 | 07 | 84 | 07 | 1F | 5C |
| M0350 | = | 6D | 4C | 90 | 0C | 6D | 70 | CC | 91 |
| M0358 | = | 07 | 3C | 84 | 04 | 29 | 03 | D3 | 21 |
| M0360 | = | FC | 50 | 73 | FD | 51 | 2A | 00 | 6F |
| M0368 | = | 28 | 03 | D6 | 4C | 8E | 70 | 88 | 81 |
| M0370 | = | 02 | C1 | 51 | 62 | 6A | 2A | 00 | 5F |
| M0378 | = | 28 | 03 | D6 | 7E | FC | 12 | 8E | 16 |
| M0380 | = | C1 | 64 | 6D | 5C | 62 | 69 | 78 | F2 |
| M0388 | = | 94 | 04 | 71 | 90 | 03 | 20 | FF | 53 |
| M0390 | = | 43 | 69 | 70 | C3 | 91 | 07 | CC | 5D |
| M0398 | = | 92 | 35 | 90 | 05 | CC | 5D | 82 | 2F |
| M03A0 | = | 4C | 21 | 30 | 54 | 4C | C3 | 59 | 63 |
| M03A8 | = | 6E | 74 | FC | 49 | 62 | 6A | 94 | 07 |
| M03B0 | = | 7F | F9 | C4 | 5C | 90 | 19 | 5C | 2A |
| M03B8 | = | 00 | 5B | 21 | 30 | 14 | 8E | 4A | 21 |
| M03C0 | = | 0F | 88 | 54 | B4 | A4 | E4 | 84 | 07 |
| M03C8 | = | 43 | 15 | CC | 5C | 90 | E9 | 74 | C0 |
| M03D0 | = | 50 | 91 | BE | 29 | 01 | 08 | 0A | 59 |
| M03D8 | = | 62 | 6A | 4C | 21 | 30 | 25 | 20 | 94 |
| M03E0 | = | 03 | 78 | 8E | 49 | 0B | 1C | 93 | 86 |
| M03E8 | = | 16 | 08 | 00 | 00 | 10 | 20 | 10 | 30 |
| M03F0 | = | 08 | 63 | 6A | 4D | 21 | 1F | 84 | 06 |
| M03F8 | = | 50 | 70 | 51 | 90 | 09 | 4C | 21 | 1F |
| M0400 | = | 84 | 36 | 50 | 71 | 51 | 75 | 52 | 40 |
| M0408 | = | 12 | 84 | 08 | 50 | 72 | C1 | 51 | 32 |
| M0410 | = | 94 | F6 | 65 | 6C | 71 | FC | 94 | 42 |
| M0418 | = | 72 | FC | 94 | 0E | 4C | 22 | 03 | 5D |
| M0420 | = | 41 | 5C | 6B | 20 | FF | 5C | 90 |  |
| M0428 | = | 31 | 4C | 21 | C4 | 22 | 01 | 5C | 6D |
| M0430 | = | 4C | 15 | C1 | 6B | 5C | 90 | 35 | 65 |
| M0438 | = | 6C | 71 | FC | 84 | 07 | 20 | C6 | FC |
| M0440 | = | 5C | 90 | 17 | 63 | 6C | 4C | 21 | 18 |
| M0448 | = | 50 | 65 | 94 | 05 | 6E | 5C | 90 | 0A |
| M0450 | = | 6C | 4C | 21 | C4 | 5C | 6E | 3C | 91 |
| M0458 | = | 02 | 0C | 20 | 1E | 5C | 78 | F0 | 65 |
| M0460 | = | 6B | 94 | 05 | 20 | 67 | 90 | 03 | 20 |
| M0468 | = | FF | DC | 5C | 65 | 6B | 4C | 54 | 58 |
| M0470 | = | 12 | 84 | 43 | A4 | 21 | F0 | B4 | 28 |
| M0478 | = | 02 | 1E | 28 | 00 | 7F | 28 | 01 | 4E |
| M0480 | = | 28 | 00 | 7F | 28 | 01 | 8F | 28 | 00 |
| M0488 | = | 7F | 28 | 01 | AB | 66 | 4D | 59 |  |
| M0490 | = | 4C | 5A | 28 | 00 | 7F | 70 | 54 | 28 |
| M0498 | = | 01 | 4E | 66 | 68 | 48 | 5C | 28 | 00 |
| M04A0 | = | 7F | 28 | 02 | 1A | 28 | 00 | 7F | 28 |
| M04A8 | = | 01 | E7 | 28 | 00 | 7F | 28 | 02 | 22 |
| M04B0 | = | 28 | 00 | 7F | 90 | 04 | 70 | 59 | 5A |
| M04B8 | = | 62 | 6B | 48 | 5E | 4A | 5E | 49 | 5D |
| M04C0 | = | 2A | 00 | 5B | 4C | 14 | 21 | 03 | 8E |
| M04C8 | = | A4 | 21 | 0F | 88 | B4 | 64 | 68 | 20 |
| M04D0 | = | 30 | 5C | 29 | 01 | 3B | 65 | 6B | 4C |
| M04D8 | = | 54 | 62 | 6A | 4E | 51 | 4C | 66 | 68 |
| M04E0 | = | 5D | 41 | 5C | 28 | 04 | E9 | 29 | 01 |
| M04E8 | = | 49 | 08 | A4 | 21 | F0 | B4 | 20 | 02 |
| M04F0 | = | 1E | 28 | 00 | 7F | 28 | 01 | 4E | 28 |
| M04F8 | = | 00 | 7F | 28 | 02 | 1A | 28 | 00 | 7F |
| M0500 | = | 28 | 01 | E7 | 28 | 00 | 7F | 28 | 02 |
| M0508 | = | 22 | 28 | 00 | 7F | 0C | 62 | 68 | 70 |
| M0510 | = | CC | 81 | 02 | 70 | 52 | 76 | 50 | 70 |
| M0518 | = | 51 | 90 | 09 | 62 | 69 | 4D | 52 | 78 |
| M0520 | = | 50 | 71 | 51 | 08 | A1 | 21 | 60 | 53 |
| M0528 | = | 22 | 04 | B1 | 43 | 22 | 06 | B1 | 20 |
| M0530 | = | 0A | 54 | 34 | 94 | FE | 43 | 22 | 04 |
| M0538 | = | B1 | 42 | 21 | 01 | C3 | B1 | 72 | 54 |
| M0540 | = | 34 | 94 | FE | A1 | 21 | 7F | 22 | 04 |
| M0548 | = | B1 | 30 | 84 | 06 | 42 | 12 | 52 | 90 |
| M0550 | = | E9 | 70 | C1 | 84 | 0B | 12 | 94 | 0C |
| M0558 | = | 4C | 42 | 74 | 50 | 51 | 90 | DB | 20 |
| M0560 | = | 10 | 90 | 02 | 78 | C3 | B1 | 20 | 46 |
| M0568 | = | 54 | 34 | 94 | FE | 70 | C3 | B1 | 0C |
| M0570 | = | 08 | 00 | 06 | 01 | 07 | 63 | 6C | 71 |
| M0578 | = | FC | 84 | 09 | A0 | 81 | 04 | 21 | 7F |
| M0580 | = | B0 | 90 | 45 | 6E | 78 | FC | 84 | 3A |
| M0588 | = | 64 | 6A | 71 | FC | 94 | 3A | 4C | 21 |
| M0590 | = | F6 | 22 | 01 | 5C | A0 | 23 | 80 | B0 |
| M0598 | = | 91 | 1C | 71 | 54 | 28 | 00 | 41 | 66 |
| M05A0 | = | 68 | 20 | 67 | DC | 59 | 5C | 71 | 54 |
| M05A8 | = | 28 | 04 | E9 | 49 | 54 | 28 | 00 | 41 |
| M05B0 | = | 49 | 54 | 28 | 04 | E9 | 62 | 68 | 4C |
| M05B8 | = | 21 | 3F | 5C | 64 | 20 | 3C | 5C | 90 |
| M05C0 | = | 07 | 64 | 6A | 4C | 21 | FE | 5C | 63 |
| M05C8 | = | 6E | 4C | 21 | 10 | 84 | 20 | 64 | 6A |
| M05D0 | = | 72 | FC | 94 | 20 | 4C | 22 | 02 | 5C |
| M05D8 | = | 62 | 68 | 4C | 23 | 80 | 5C | 64 | 6A |
| M05E0 | = | 91 | 06 | 20 | F7 | FC | 90 | 04 | 4C |
| M05E8 | = | 22 | 08 | 5C | 90 | 07 | 64 | 6A | 4C |
| M05F0 | = | 21 | FD | 5C | 63 | 6F | 4C | 21 | 18 |
| M05F8 | = | 84 | 3B | 50 | 64 | 69 | 3C | 81 | 35 |
| M0600 | = | 62 | 68 | 78 | F0 | 94 | 15 | 64 | 6A |
| M0608 | = | 4C | 21 | F7 | 5C | 62 | 68 | 71 | CC |
| M0610 | = | 21 | 7F | 25 | 3F | 81 | 11 | 20 | 3F |
| M0618 | = | 90 | 0D | 4C | 24 | FF | 51 | 13 | 41 |
| M0620 | = | 81 | 05 | 21 | 80 | 90 | 01 | 5C | 12 |
| M0628 | = | 12 | 12 | 21 | 07 | 2A | 06 | 35 | 8E |
| M0630 | = | 64 | 69 | 16 | 5C | 0D | 13 | 09 | 06 |
| M0638 | = | 05 | 03 | 02 | 02 | 01 | 08 | 66 | 6D |
| M0640 | = | 01 | 5E | 00 | 5C | 63 | 71 | FD | 50 |
| M0648 | = | 20 | 18 | FD | C0 | 50 | 74 | FC | C0 |
| M0650 | = | 84 | 04 | 29 | 06 | F3 | 70 | B6 | A1 |
| M0658 | = | 21 | 7F | 22 | 60 | 51 | 21 | 3F | B1 |
| M0660 | = | 2A | 06 | 9E | 0E | 2A | 06 | 7E | 11 |
| M0668 | = | 4A | 04 | 4B | 05 | 20 | 7A | B7 | 20 |
| M0670 | = | CF | 50 | 75 | B6 | 1B | 70 | 1F | 25 |
| M0678 | = | 04 | 81 | FC | 1A | 90 | 27 | 7E | B6 |
| M0680 | = | 1B | 70 | 2B | 2B | 30 | 94 | FC | 1A |
| M0688 | = | B6 | A7 | 50 | 30 | 40 | 14 | 94 | 0F |
| M0690 | = | 45 | E0 | 84 | 30 | 47 | 14 | 25 | 05 |
| M0698 | = | 91 | 1E | 40 | 55 | 90 | 07 | 47 | 14 |
| M06A0 | = | 25 | 05 | 91 | 14 | 7F | F7 | 25 | 09 |
| M06A8 | = | 84 | 09 | 47 | 1F | 57 | 14 | 25 | 0B |
| M06B0 | = | 84 | 23 | 7F | F7 | 57 | 90 | 32 | 47 |
| M06B8 | = | 14 | 25 | 0B | 84 | E8 | 20 | F0 | C7 |
| M06C0 | = | 57 | 90 | 26 | 47 | 14 | 1F | 25 | 0B |
| M06C8 | = | 81 | 03 | 47 | 14 | 15 | 57 | 25 | B0 |
| M06D0 | = | 94 | 17 | 45 | 56 | 2A | 06 | FA | 46 |
| M06D8 | = | 8E | 16 | 50 | 14 | 12 | 24 | 1A | 0B |
| M06E0 | = | 20 | 1F | F0 | 50 | 18 | FC | C0 | 5C |
| M06E8 | = | 41 | B1 | 2B | 2B | 2B | 2B | 2B | 2B |
| M06F0 | = | 2B | 70 | B6 | 66 | 6D | 4E | 05 | 4C |
| M06F8 | = | 04 | 0C | 01 | 21 | 02 | 22 | 04 | 24 |
| M0700 | = | 08 | 28 | 10 | 30 | B0 | A8 | 88 | 90 |
| M0708 | = | 50 | 48 | 63 | 6E | 71 | FC | 94 | 04 |
| M0710 | = | 29 | 07 | 95 | 64 | 6A | 20 | 80 | FC |
| M0718 | = | 84 | 16 | 65 | 3C | 94 | 0F | 7F | 5E |
| M0720 | = | 4C | 50 | 62 | 6B | 4C | 51 | 40 | 5C |
| M0728 | = | 65 | 69 | 41 | 5C | 29 | 07 | A2 | 2A |
| M0730 | = | 07 | A3 | 70 | 50 | 74 | 51 | 60 | 6A |
| M0738 | = | 16 | 5C | 42 | 18 | 52 | 5C | 0A | 25 |
| M0740 | = | 3F | 84 | 05 | 1F | 0B | 90 | F4 | 60 |
| M0748 | = | 6A | 40 | CC | 50 | 0A | 25 | 3F | 84 |
| M0750 | = | 05 | 1F | 0B | 90 | F5 | 31 | 81 | DF |
| M0758 | = | 2A | 00 | 00 | 20 | 9C | 51 | 77 | 52 |
| M0760 | = | 40 | 88 | 50 | 31 | 94 | FB | 32 | 81 |
| M0768 | = | F8 | 20 | 66 | D0 | 50 | 60 | 6A | 70 |
| M0770 | = | 5C | 0A | 25 | 3F | 84 | 05 | 1F | 0B |
| M0778 | = | 90 | F6 | 62 | 6B | 40 | 5E | 64 | 4C |
| M0780 | = | 22 | 80 | 5E | 65 | 20 | FF | 5D | 7F |
| M0788 | = | 5C | 08 | 78 | 59 | 28 | 02 | 4E | 39 |
| M0790 | = | 94 | FB | 09 | 90 | 0E | 64 | 6A | 70 |
| M0798 | = | CC | 81 | 08 | 4C | 21 | 7F | 5C | 29 |
| M07A0 | = | 00 | 00 | 1C | 00 | FF | 55 | AA | 90 |

What is claimed is:

1. A system for controlling a television receiver having a varactor tuner comprising:
   (a) a microprocessor;
   (b) control selection means for supplying data signals to said microprocessor indicating specific channels to be tuned on said television receiver;
   (c) a memory containing a plurality of tuning words specifying the tuning voltages for said varactor tuner, each of said tuning words having an address associated with a channel number;
   (d) said microprocessor operating to recall a tuning word from memory in response to a data signal received from said control selection means and to convert said tuning word into a digital signal representing a tuning voltage for said varactor tuner;
   (e) digital to analog conversion means converting each said digital signal into a d.c. voltage which it applies to said varactor tuner; and
   (f) a second control means supplying data signals to said microprocessor to cause it to recall each of said tuning words in sequence, whereby each channel associated with a tuning word is tuned in sequence.

2. The apparatus of claim 1 further comprising display means operatively coupled to said microprocessor and responsive to said data signals to display the associated channel numbers.

3. A microprocessor controller for controlling the volume on a television receiver comprising:
   (a) a volume selection switch providing a contact closure indicating a desired increase in volume level;
   (b) a microprocessor having an input port connected to said contact closure, said microprocessor having a program stored within for detecting said contact closure and providing a multibit digital signal the bits of which are determined by the length of time said switch contact is closed; and
   (c) digital conversion means connected to said microprocessor output port for receiving said multibit digital signal and producing an output signal comprising a d.c. voltage proportional to said multibit digital word.

4. A microprocessor controller for controlling a television receiver comprising:
   (a) keyboard selection means having a first set of keys for generating signals indicating function levels to be changed and a second set of keys for generating signals indicating channels to be tuned;
   (b) remote command sensing means for providing a first set of signals indicating channels to be tuned and a second set of signals indicating function levels to be changed;
   (c) memory means containing channel tuning data;
   (d) a microprocessor having an input port connected to said remote command sensing means and said keyboard selection means, said microprocessor being programmed to operate sequentially to determine the presence at its input port of any signals from said keyboard selection means and said remote command sensing means and to initiate channel changes and function level changes as indicated by such signals; said microprocessor initiating such channel changes by recalling channel tuning data from said memory means in response to a signal indicating a channel is to be tuned and by converting said channel tuning data into a first set of digital signals corresponding to the tuning voltage for said channel to be tuned; said microprocessor initiating such function level changes by generating a second set of digital signals corresponding to the new function level in response to a function level change indicated by signals from said keyboard selection means or said remote channel sensing means; and
   (e) digital conversion means operably connected to said microprocessor converting each first set of digital signals into a first d.c. voltage for tuning a varactor tuner; and converting each second set of digital signals into a second d.c. voltage indicating a new function level.

5. A system for controlling a television receiver comprising:
   (a) a source of transmitted signals, each having a different frequency associated with a different controllable function of said television receiver;
   (b) a microprocessor control system including a data bus and responsive to said transmitted signals for providing different digital signals on said data bus in response to different transmitted signals;
   (c) digital to analog conversion means connected to said microprocessor control system and producing d.c. voltages proportional to the different digital signals on said data bus; and
   (d) means responsive to said d.c. voltages for controlling and different controllable functions;
   (e) said source of transmitted signals including a volume selection switch capable of producing a signal indicative of a desired increase in volume level, said desired increase in volume level being one of said functions, and said means responsive to said d.c. voltages controlling the volume control means of said television receiver.

6. A system according to claim 5, including transducer means receiving each of said transmitted signals and providing in response to each a different signal current having a frequency corresponding to its associated transmitted signal and wherein said microprocessor control system responds to said signal currents for producing said digital signals.

7. A system according to claim 5, wherein said means responsive to said d.c. voltages controls a varactor tuner and wherein said functions to be controlled also include the tuning frequencies of said television receiver, said d.c. voltages being applied to said varactor tuner for tuning purposes.

8. A system according to any one of claims 5, 6 or 7 wherein said source of transmitted signals is apparatus remote from said television receiver.

9. A system for remotely controlling a television receiver comprising:
   (a) a source of remotely transmitted signals, each having a different frequency associated with a different controllable function of said television receiver;
   (b) transducer means for receiving said signals and providing a signal current for each, each having a frequency identical to its corresponding transmitted signal;
   (c) a microprocessor control system having an internal program for determining the frequencies of said signal currents, said microprocessor control system including a validation program for continuously sampling said signal currents and determining when a valid signal is being transmitted, said microprocessor control system also including a data bus and being responsive to said transmitted signals for providing different digital signals on said data bus in response to different transmitted signals;

(d) digital to analog conversion means connected to said microprocessor control system and producing d.c. voltages proportional to the different digital signals on said data bus; and (e) means responsive to said d.c. voltages for controlling said different controllable functions.

10. A system according to claim 9, wherein said means responsive to said d.c. voltages controls a varactor tuner and wherein said functions to be controlled include the tuning frequencies of said television receiver, said d.c. voltages being applied to said varactor tuner for tuning purposes.

* * * * *